United States Patent [19]

Murrmann et al.

[11] 4,014,714
[45] Mar. 29, 1977

[54] METHOD OF PRODUCING A MONOLITHIC SEMICONDUCTOR DEVICE

[75] Inventors: Helmuth Murrmann, Ottobrunn; Ulrich Schwabe, Munich, both of Germany

[73] Assignee: Siemens Aktiengesellschaft, Berlin & Munich, Germany

[22] Filed: Aug. 1, 1975

[21] Appl. No.: 601,222

[30] Foreign Application Priority Data

Aug. 8, 1974 Germany .................... 2438256

[52] U.S. Cl. .................... 148/1.5; 148/187
[51] Int. Cl.² .................... H01L 21/265
[58] Field of Search .................... 148/1.5, 187

[56] References Cited
UNITED STATES PATENTS

| | | | |
|---|---|---|---|
| 3,725,150 | 4/1973 | George | 148/1.5 X |
| 3,755,001 | 8/1973 | Kooi et al. | 148/1.5 |
| 3,783,047 | 1/1974 | Paffen et al. | 148/1.5 X |
| 3,808,058 | 4/1974 | Henning | 148/1.5 |

Primary Examiner—L. Dewayne Rutledge
Assistant Examiner—J. M. Davis
Attorney, Agent, or Firm—Hill, Gross, Simpson, Van Santen, Steadman, Chiara & Simpson

[57] ABSTRACT

A combination insulating means comprised of a pn-junction overlaid with a $SiO_2$ filling within a groove is provided between IC elements in a monolithic semiconductor device. Such combination insulating means electrically and mechanically isolate at least two areas of a n-conductive surface zone, each of which supports an IC element. The n-conductive surface zone is supported on a p-conductive silicon base and the free surface of the n-conductive surface zone is coated with a $Si_3N_4$ layer, which during the various fabrication steps of the monolithic semiconductor device protects coated areas of the n-conductive surface zone from etchants, oxidation and from dopants.

9 Claims, 3 Drawing Figures

METHOD OF PRODUCING A MONOLITHIC SEMICONDUCTOR DEVICE

BACKGROUND OF THE INVENTION

1. Field of the Invention

The invention relates to monolithic semiconductor devices and somewhat more particularly to a method of producing such devices wherein zones of different conductivity are isolated from one another and IC elements are placed on such isolated zones.

2. Prior Art

German Offenlegungschrifts 2,203,183 and 2,224,634 (which respectively correspond to U.S. Pat. No. 3,648,125 and Australian Published Application No. 42,414/72 generally describe a method of fabricating a monolithic semiconductor device from a silicon body in which a surface zone thereof exhibits a first conductivity and the remainder of the body exhibits an opposing conductivity. The surface zone is covered by a $Si_3N_4$ layer which consists of two separate areas which are utilized as an etching mask to produce an isolation groove-like cavity in the surface zone at the location between such $Si_3N_4$ layer is utilized as an oxidation mask to oxidize the silicon surface within the isolation groove to such an extent that a resulting $SiO_2$ filling divides the surface zone into two separate areas which remain contiguous only via the underlying portion of the silicon body (which is of an opposing conductivity to that of the so-divided surface zone). Thereafter, a select element of a circuit is fabricated on each of such separate zone areas to complete the monolithic semiconductor device.

In many instances, the foregoing fabrication technique provides relatively satisfactory results. However, in other instances, it is apparent that the insulation between the separate surface zones is insufficient and this defect appears to be attributable to the oxidation of the groove surface, which influences the dopant concentration in the area of the underlying silicon body that borders the $SiO_2$ produced during such oxidation. In some instances, this defect may be overcome by increasing the dopant concentration in the area of opposing conductivity and at the edges of the surface zone, or, after etching the isolation groove, by subjecting the newly uncovered silicon surface to the influence of an activator in the presence of heat, so as to create the desired conductivity in the silicon body (i.e. opposite to the conductivity of the surface zone thereof). However, such remedial procedures often fail, particularly if the surface zone is n-conductive and the remainder of the silicon body is p-conductive because the doping, which must occur, then effects the entire silicon surface in the isolation groove and tends to extend into both areas of the so-divided surface zone. This is particularly detrimental in instances where the so-divided surface zone areas (with the exception of the insulating $SiO_2$ layer therebetween) are utilized within an electrical circuit such as an integrated circuit.

SUMMARY OF THE INVENTION

The invention provides a process which overcomes the aforesaid prior art drawbacks whereby an unchanging $Si_3N_4$ mask is used to limit the doping area of the silicon surface in the groove-like isolation cavity to the centralized base area thereof and away from the side walls thereof and doping, by an approximately vertically orientated ion beam, of such a base area is conducted prior to the oxidation step for filling the isolation groove.

In accordance with the principles of the invention, a combination insulating means comprised of a pn-junction overlaid with a $SiO_2$ filling within an isolation groove is provided between electrical elements of a monolithic semiconductor device. In this manner, mechanical and electrical isolation of adjacent conductive areas is achieved and conductive channels through the $SiO_2$ filling are avoided.

DESCRIPTION OF THE PREFERRED EMBODIMENTS

Figure 1:
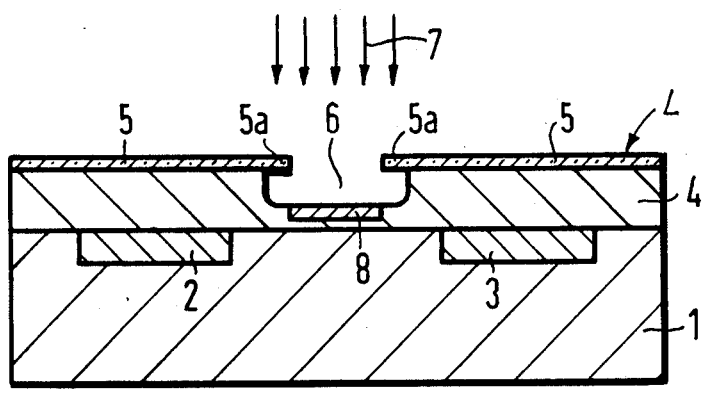
FIGS. 1 through 3 are elevated sectional views, somewhat schematic in nature, illustrating different stages of fabricating a monolithic semiconductor device in accordance with the principles of the invention.

In accordance with the principles of the invention, an unchanging $Si_3N_4$ mask is utilized to limit the doping area of the silicon surface in a groove-like isolation cavity to a centralized base area of the cavity and away from the side walls thereof and doping (by an ion beam directed approximately perpendicularly to such silicon surface) of such a base area is carried out prior to the oxidation process.

If a structural $Si_3N_4$ layer is formed on a surface zone with one or more openings or windows therein for use as an etching mask to produce cavities, such as isolation cavities, in the surface zone at locations thereon corresponding to such windows, it is necessary that such an etching mask be resistant to the etching material used to produce the cavities. Accordingly, such a structural $Si_3N_4$ layer remains unchanged during such an etching process. Further, the use of such an etching mask causes the edges of the mask bordering on the windows or openings therein to protrude somewhat in relation to the side walls of the grooves or cavities etched through such windows.

In following the principles of the invention, one utilizes such an unchanged etching mask as a doping mask during an ion implantation step so that the border areas of the silicon surface in the isolation groove (i.e. the peripheral walls thereof) are not affected by the doping because of the protection or shading afforded by the protruding edges of such a doping mask. Of course, this type of doping mask would not be effective to protect the isolation groove side walls from doping if a diffusion doping process were utilized.

Referring now to the drawings wherein like reference numerals designate like parts or elements, two spaced-apart $n^+$conductive zones 2 and 3 are produced on the surface of a p-conductive monocrystalline silicon body or disc 1 by conventional mask diffusion techniques. Zones 2 and 3 form the so-called "buried layers" typically used in fabricating integrated circuits (IC) for reasons of insulation and/or contacting. However, in themselves, such buried layers may be non-essential and do not materially affect the invention.

On a surface of the silicon disc 1 (preferably the surface provided with the $n^+$-conductive zones 2 and 3), an epitaxial n-conductive surface zone 4 aslo composed of silicon is provided in a conventional manner. The surface zone 4 is the zone treated by the principles of the invention. As may be appreciated, the surface zone 4 may be produced via epitaxial techniques, diffusion techniques or ion implantation techniques.

The surface zone 4, however produced to a thickness of about 1.5 to 3μm, is then coated with substantially uniform Si₃N₄ layer L having a thickness of about 1500 AE. Typically, such a Si₃N₄ layer is pyrolytically deposited on the free face of zone 4 at temperatures above about 800° C. from known reaction gases (for example, a mixture of SiH₄, NH₄ and an inert gas) so that such layer is resistant to a silicon etchant, such as hydrofluroic acid. With the aid of a suitale etching mask, portions of the layer L are then removed in a desired pattern, for example, so that the strip or area thereof extending between the two n⁺-conductive zones 2 and 3 is removed.

A suitable etchant for Si₃N₄ is, for example, hot orthophosphoric acid. A suitable etching mask for creating a desired opening pattern in the Si₃N₄ layer L may be formed from a photolacquer or resist which is rendered resistant to phosphoric acid by an annealing process. Alternatively, the etching mask for the Si₃N₄ layer may be formed of a SiO₂ layer having appropriate windows therein formed via a conventional photo-lacquer etching mask, which is later removed, for example, during the etching of the isolation groove.

By means of the process just described, the Si₃N₄ layer L is changed into a SiN₄ etching mask 5. The term "Si₃N₄ etching mask" as used herein and in the claims is intended to express the fact that during the ensuing etching process which produces the groove-like isolation cavities between individual elements of a semiconductor device being formed, the etching medium used does not affect the Si₃N₄ since otherwise, as is readily apparent, the usefulness of the invention may be jeopardized. However, it is immaterial for the purposes of the invention if during the production of the isolation cavities the Si₃N₄ mask 5 is covered with an additional layer of an etch-resistant material, for example, composed of a photo-lacquer material (such as may result from a photo-lacquer mask used in the production of the Si₃N₄ etching mask).

With the aid of the Si₃N₄ mask 5, the material of the n-conductive surface zone 4 (in the instant exemplary embodiment, comprising an epitaxial silicon layer) is removed along a select dimension of the body 1 so as to form continuous groove or groove-like cavity 6. Typically, but not necessarily, the depth of groove 6 is controlled to be about one-half to two-thirds of the thickness of the surface zone 4. If desired, the groove 6 may extend into the p-conductive area of the silicon body 1. The groove 6 must be of sufficient depth to sub-divide the zone 4 into at least two areas which are completely separated from one another. This stage of fabrication is illustrated at FIG. 1.

In general, more than two electrical elements of a monolithic semiconductor device may be produced in the surface zone 4 and each such element is isolated from an adjoining element via a groove, such as isolation groove 6. Accordingly, it will be understood that more than one isolation groove may be produced, as desired.

A suitable etching media for the production of a groove 6 comprises, for example, a HF-H₂O₂ mixture or a HF-HNO₃ mixture diluted with deionized water and so formulated that it does not affect the Si₃N₄ etching mask 5. A suitable etching medium is described in U.S. Ser. No. 527,894, filed Nov. 27, 1974, now Pat. No. 3,977,925, assigned to the instant assignee and which is incorporated herein by reference.

By the use of such a suitable etching medium, one or more grooves 6 may be produced. Portions of the surface zone 4 still covered with the Si₃N₄ etching mask 5 protrude between such grooves. Since the etching media attacks at least some portion of the silicon surface underneath the Si₃N₄ etching mask 5, an underetching at the edges of the groove 6 is unavoidable and a strip 5a of the mask 5 protrudes over both edges of the groove 6 so as to shade or mask the respective side walls thereof. These protruding strips 5a are utilized in the subsequent doping process of the silicon surface at the base of the groove 6. Generally, it is preferable to control the etching process so that the dimension of the strips 5a extending over the groove 6 is at least about 0.2μm and preferably it is 0.5μm.

After the production of groove 6, suitable acceptor ions are shot into the centralized base area of such a groove via a ion beam 7 which is guided approximately vertically or normally to the silicon surface at the base of groove 6, such as schematically illustrated at FIG. 1. The energy of these ions, which in a preferred embodiment comprise simply charged boron ions, is maintained sufficiently low so that they do not penetrate the Si₃N₄ etching mask 5 which is, for example, about 1500 AE thick so that the Si₃N₄ strips 5a effectively shield the banks or side walls of groove 6 from the ions. In this manner, the flank surfaces of zone 4 which define the groove 6 on both sides thereof are not doped. Thus, the previous Si₃N₄ etching mask 5 functions at this stage of the invention as an implantation mask and thus as a doping mask.

As a result of this ion implantation, a p⁺-conductive zone 8 is formed at the centralized base area of the groove 6. The zone 8 typically has a depth of about 0.3μm and extends across the entire length of the groove 6. Thereafter, the resultant structure is subjected to oxidation conditions so as to produce a SiO₂ layer or filling 9 within the groove 6. The SiO₂ filling 9 more or less completely fills the isolation groove or cavity 6 and coats the walls thereof without any gaps. The oxidation process takes place under conditions which preclude oxidation of the silicon covered by the Si₃N₄ etching mask 5. Such oxidation conditions may be achieved by using somewhat lower than typical oxidation temperatures, i.e. not over about 1100°C. Water vapor is an excellent oxidation agent but other oxidizing agents may also be used. If desired, the SiO₂ filling 9 may also be formed via an anodic oxidation process, which may take place at room temperature.

Figure 2:
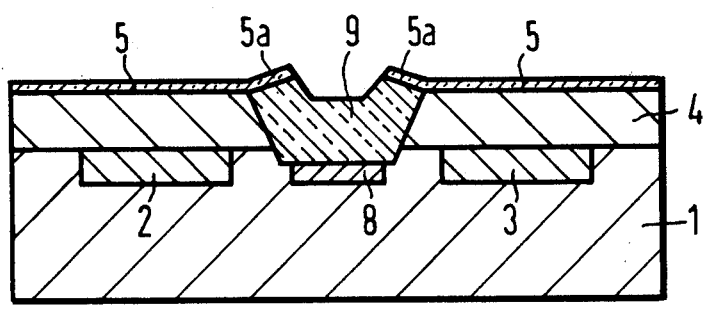

The SiO₂ layer or filling 9 grows, as by expansion, within groove 9 and at least partially into the silicon material around the groove. The SiO₂ filling 9 must be allowed to grow sufficiently (generally to a thickness of at least 1.5μm) into this silicon material so that any n-conductive bridge or the like between the n-conductive surface zone areas separated by the groove 6 is destroyed. This is facilitated or actually made possible by the presence of the p⁺-conductive zone 8 at the base area of the groove 6. The zone 8 is somewhat forced or pushed downward by the front of the SiO₂ filling 9, such as can be visualized from a comparison between FIGS. 1 and 2. This insures that the otherwise readily occurring conversion of the dopant in front of a wandering oxide front is prevented. Typically, in the manufacture of integrated circuits, a relatively highly resistive base material, such as a silicon body 1, is used having a specific resistance of at last 5 Ohm · cm and preferably having a specific resistance of about 8 Ohm · cm. Such highly resistant base material readily changes its conductivity at the edges of the $SiO_2$ filling 9 produced within the groove 6 so that a conductive bridge between the areas of the n-conductive surface zone 9 separated by groove 6 and the $SiO_2$ filling 9 is formed, regardless of the thickness of the $SiO_2$ layer 9. An arrangement obtained after the production of the $SiO_2$ filling 9 within a groove 6 is illustrated at FIG. 2.

Thereafter, select circuit elements are fabricated on the isolated surface areas of zone 4, either by conventional technology or by the process described by Graul et al U.S. Patent application Ser. No. 594,341, now U.S. Pat. No. 3,963,524, assigned to the instant assignee and which is incorporated herein by reference.

In an exemplary embodiment, a procedure for forming a transistor element in the sub area of the n-conductive surface zone 4 lying to the left of the groove 6 and a procedure for forming a diode element in the sub area on the right of the groove 6 is provided. As a first step in such a fabricating process, the arrangement shown at FIG. 2 may be subjected to a new or further ion implantation on the surface thereof covered with the $Si_3N_4$ etching mask 5. This further ion implantation is preferably also conducted with acceptor ions, for example, boron ions, having sufficient energy to penetrate the $Si_3N_4$ etching mask 5 (as contrasted to the relatively low energy of the ions used during the first implantation step to produce zone 8). The penetrating ions have enough energy to enter, at least to some extent, the silicon material within zone 4, without however reaching the lower boundary of such zone against the p-conductive material 1 or the $n^+$-conductive zones 2 or 3, either below the zone 4 or below the $SiO_2$ filling 9 in groove 6. Thus, on either side of the groove 6 filled with the $SiO_2$ filling 9, there remains a portion of the n-conductive surface zone 4. Such remaining portion on the left side of filling 9 (i.e. in the case of fabricating a transistor) forms a collector zone and on the right side of filling 9 (i.e. in the case of fabricating a diode), forms one of the zones which defines a pn-transfer or junction.

Figure 3:
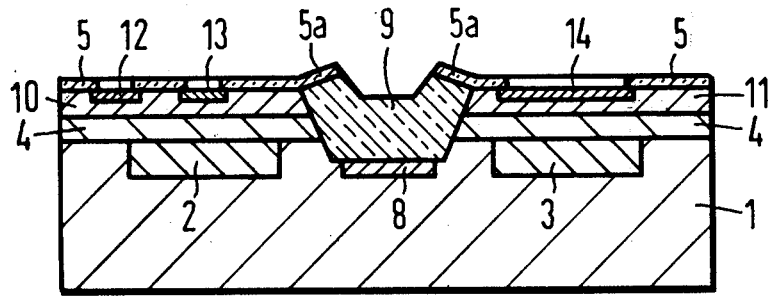

Due to this further ion implantation step, the second of the zones defining the pn-transfer (junction) of such a diode, i.e. zone 11 in FIG. 3, as well as the base or collector zone 10 of the transistor being fabricated have now been formed. It is to be noted that the thickness of the $SiO_2$ filling 9 in groove 6 significantly exceeds that of the $Si_3N_4$ etching mask 5. Preferably, the thickness of the $SiO_2$ filling 9 is about $2\mu m$ so that control and/or adjustment of the ion kinetic energy necessary to produce the p-conductive zones 10 and 11 is relatively simple.

Thereafter, the $Si_3N_4$ etching mask 5 which still covers the silicon surface on either side of the groove 6 (and the $SiO_2$ filling 9 therein), may be directly used as a diffusion mask to produce the $p^+$-conductive base contact zone 12 and the $n^+$-conductive emitter zone 13 of the transistor element.

To proceed in this fashion, a first etching mask, for example, consisting of a phosphoric-resistant photo-lacquer, is applied onto the $Si_3N_4$ masks 5 and suitably exposed and developed so as to initially only remove a portion of the $Si_3N_4$ mask from the silicon surface at a location thereon corresponding to a desired location of the base contact zone 12 and, if desired, at a location corresponding to a desired position of a contact zone 14 for the p-conductive diode zone 11. Thereafter, the two $p^+$-conductive contact zones 12 and/or 14 are formed by conventional diffusion of boron atoms sion operation is conducted in the presence of oxygen so that the diffusion windows are again covered with a $SiO_2$ mask.

Then a second photo-lacquer etching mask is applied onto the so-formed arrangement and developed via conventional techniques so that a window above the desired position of an emitter zone 13 is produced. The emitter zone 13 is then fabricated, for example, by diffusion or implantation techniques with suitable donor ions. This doping process with donor ions, for example, phosphorus or arsenic, is regulated in such a manner that the reamining portions of the $Si_3N_4$ etching mask 5 and the $SiO_2$ layers covering the windows of the first etching mask (i.e. used to produce zones 12 and/or 14) functions as a barrier to the donor ions. Finally, the desired location of the contacts, which are covered with a $SiO_2$ layer, are again uncovered, for example, by etching with a buffered hydrofluoric acid (and it is to be noted that the $SiO_2$ filling 9 is sufficiently thick to be substantially unaffected by such etching process) and the resultant arrangement is then provided with electrodes in a conventional manner.

As will be readily apparent, the invention may also be combined with doping procedures different from the exemplary embodiment described above. It should again be noted that the $Si_3N_4$ etching mask, may, if desired, be covered during the entire fabrication sequence described above with a $SiO_2$ layer. Such a $SiO_2$ layer may be used, for example, in accordance with known techniques as an etching mask in forming the $Si_3N_4$ etching mask (i.e. for producing desired windows in the $Si_3N_4$ layer), which may then later be used for fabricating of additional diffusion masks as required in fabricating select elements on the isolated surface zone areas of a semiconductor body.

It will also be appreciated that the fabrication of individual circuit elements of an IC circuit may occur in a basically different manner from that described above, for example, if conventional planar technology is employed of if the process described in Graul et al U.S. Ser. 554,164, filed Feb. 28, 1975, assigned to the instant assignee and incorporated herein by reference, and/or in the earlier noted Graul et al U.S. Pat. No. 3,963,524 is utilized.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appendant claims.

We claim as our invention:

1. A method of fabricating a monolithic silicon semiconductor device having a surface zone exhibiting a first conductivity from a silicon crystal doped differently from said surface zone, the steps comprising:
   applying a silicon nitride layer consisting of at least two separate areas onto a free face of said surface zone for use as an etching mask;
   etching a groove-like cavity between said silicon nitride layer areas;
   guiding a dopant ion beam substantially perpendicularly to a centralized base area of said cavity while using said silicon nitride layer areas as an implantation mask so that only such cavity base area becomes doped;

oxidizing the resultant doped cavity base area while using said silicon nitride layer areas as an oxidation mask so that a silicon dioxide layer forms only in said groove-like cavity and completely separates said surface zone into at least two separate sections; and treating said separate surface zone sections with a second dopant ion beam having sufficient energy to penetrate said silicon nitride layer areas and implant dopant within said separate surface zone sections so as to fabricate an element of a semiconductor device in each of said separate surface zone sections.

2. A method as defined in claim 1 wherein said silicon crystal is of a given conductivity and said surface zone is comprised of at least two separate sections of a first conductivity opposite to the given conductivity, and including epitaxially applying a silicon layer onto said surface zone sections, said epitaxial silicon layer being of the same coductivity as said surface zone sections but having a lower dopant concentration therein relative to said surface zone sections;

etching said groove-like cavity within said epitaxial silicon layer so that such cavity extends only between said separate surface zone sections; and selecting a dopant ion beam for use prior to the oxidation step as well as after such oxidation step so that the doped cavity base area and the doped surface zone sections below both sections of said epitaxial silicon layer exhibits the given conductivity of said silicon crystal.

3. A method as defined in claim 2 wherein said selected dopant ion beam imparts a lower conductivity to said cavity base area and said surface area sections relative to the conductivity of said silicon crystal.

4. A method as defined in claim 3 wherein said silicon crystal is of the p-type conductivity, said cavity base area is of the $p^+$-type conductivity, said surface zone sections are of the p-type conductivity, said epitaxial layer areas above said surface zone sections are of the n-type conductivity and said surface zone sections are of the $n^+$-type conductivity.

5. A method as defined in claim 1 wherein said oxidizing step for forming a silicon dioxide layer in the groove-like cavity is conducted until the thickness of such dioxide layer substantially exceeds the thickness of the two separate silicon nitride layer areas.

6. A method as defined in claim 1 wherein the formation of said groove-like cavity between said silicon nitride layer areas involves forming such cavity so that the edges of such silicon nitride layer areas adjacent said cavity protrude over the transverse axial boundary of said cavity a distance of at least about $0.2 \mu m$.

7. A method as defined in claim 1 wherein said oxidation step is conducted at a temperature below 1100° C. and in the presence of water vapor.

8. A method as defined in claim 1 wherein said oxidation step is conducted at room temperature via an anodic oxidation process.

9. A method as defined in claim 1 wherein the silicon nitride layer areas only over said separate surface zone areas are removed after treatment of said zone areas by a dopant ion beam and after the oxidation step while the remaining silicon nitride layer areas are used as a diffusion mask while fabricating additional doped areas within the so-uncovered surface area zones so as to complete the semiconductor device being fabricated.

* * * * *